United States Patent
Kagawa et al.

(10) Patent No.: US 12,432,945 B2
(45) Date of Patent: Sep. 30, 2025

(54) CAPACITOR

(71) Applicant: Murata Manufacturing Co., Ltd., Nagaokakyo (JP)

(72) Inventors: Takeshi Kagawa, Nagaokakyo (JP); Masatomi Harada, Nagaokakyo (JP); Hiroshi Matsubara, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 456 days.

(21) Appl. No.: 17/521,206

(22) Filed: Nov. 8, 2021

(65) Prior Publication Data

US 2022/0059646 A1    Feb. 24, 2022

Related U.S. Application Data

(63) Continuation of application No. PCT/JP2020/008963, filed on Mar. 3, 2020.

(30) Foreign Application Priority Data

May 21, 2019  (JP) .................... 2019-095379

(51) Int. Cl.
*H10D 1/68*    (2025.01)

(52) U.S. Cl.
CPC .................... *H10D 1/692* (2025.01)

(58) Field of Classification Search
CPC ............... H01L 28/40–92; H01L 28/94; H01L 29/66181; H01L 29/945
See application file for complete search history.

(56) References Cited

U.S. PATENT DOCUMENTS

| | | | |
|---|---|---|---|
| 2002/0022331 A1* | 2/2002 | Saran | H01L 21/76808 257/532 |
| 2006/0030101 A1* | 2/2006 | Shin | H01L 28/40 257/E21.582 |
| 2008/0142864 A1* | 6/2008 | Takahashi | H10B 53/00 257/E29.345 |
| 2009/0166074 A1* | 7/2009 | Furuya | H01G 4/228 174/260 |

(Continued)

FOREIGN PATENT DOCUMENTS

| JP | H11329895 A | 11/1999 |
|---|---|---|
| JP | 2009010114 A | 1/2009 |

(Continued)

OTHER PUBLICATIONS

International Search Report issued for PCT/JP2020/008963, date of mailing Jun. 9, 2020.

(Continued)

*Primary Examiner* — Fernando L Toledo
*Assistant Examiner* — Marshall Mu-Nuo Hatfield
(74) *Attorney, Agent, or Firm* — ArentFox Schiff LLP

(57) ABSTRACT

A capacitor that includes a substrate; a capacitor structure including a lower electrode on the substrate, a dielectric film on the lower electrode and having a via hole, and an upper electrode on the dielectric film; a first terminal electrode in the via hole and electrically connected to the lower electrode; and a second terminal electrode electrically connected to the upper electrode. The width of the via hole of the dielectric film is less than or equal to twice the film thickness of the first terminal electrode.

17 Claims, 9 Drawing Sheets

(56) References Cited

U.S. PATENT DOCUMENTS

| | | | |
|---|---|---|---|
| 2010/0271753 A1* | 10/2010 | Wang | H01G 4/30 361/305 |
| 2011/0073991 A1* | 3/2011 | Kuriki | H01G 11/84 257/532 |
| 2013/0278568 A1* | 10/2013 | Lasiter | H01L 28/90 29/829 |
| 2017/0309404 A1 | 10/2017 | Watanabe et al. | |
| 2018/0040422 A1* | 2/2018 | Shin | H01G 4/30 |
| 2019/0122820 A1 | 4/2019 | Harada et al. | |
| 2019/0311854 A1 | 10/2019 | Harada et al. | |
| 2020/0082989 A1 | 3/2020 | Kagawa et al. | |

FOREIGN PATENT DOCUMENTS

| | | | |
|---|---|---|---|
| JP | 2017195322 A | 10/2017 |
| WO | 2018003445 A1 | 1/2018 |
| WO | 2019021827 A1 | 1/2019 |
| WO | 2019026641 A1 | 2/2019 |

OTHER PUBLICATIONS

Written Opinion of the International Searching Authority issued for PCT/JP2020/008963, date of mailing Jun. 9, 2020.

\* cited by examiner

FIG. 12 – PRIOR ART
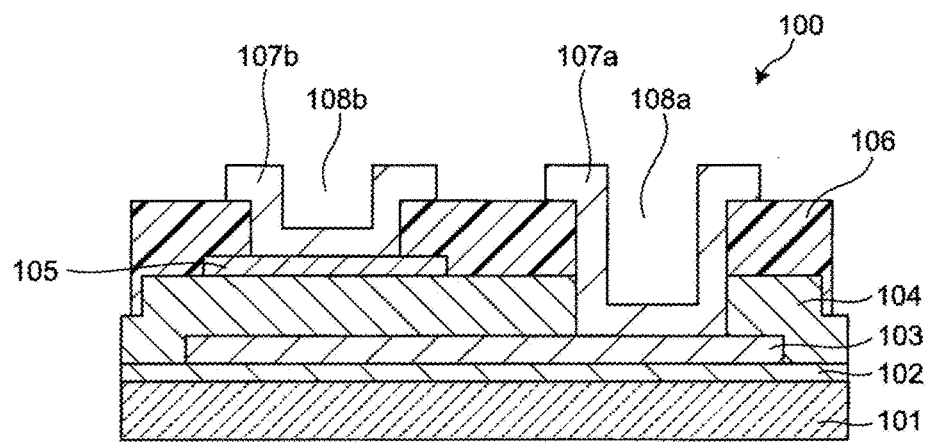

CAPACITOR

CROSS REFERENCE TO RELATED APPLICATIONS

The present application is a continuation of International application No. PCT/JP2020/008963, filed Mar. 3, 2020, which claims priority to Japanese Patent Application No. 2019-095379, filed May 21, 2019, the entire contents of each of which are incorporated herein by reference.

FIELD OF THE INVENTION

The present disclosure relates to a capacitor.

BACKGROUND OF THE INVENTION

For example, a metal insulator metal (MIM) capacitor is a well-known representative example of a capacitor element used in semiconductor integrated circuits. An MIM capacitor is a capacitor having a parallel plate structure in which an insulator is sandwiched between a lower electrode and an upper electrode.

For example, Patent Document 1 discloses a capacitor 100 in which an insulating film 102, a lower electrode 103, a dielectric film 104, and an upper electrode 105 are sequentially formed on a substrate 101 and in which one terminal electrode 107a and another terminal electrode 107b, which penetrate through a protective layer 106 formed on the aforementioned layers, are respectively connected to the lower electrode 103 and the upper electrode 105, as illustrated in FIG. 12. The capacitor 100 forms a thin film capacitor in which the lower electrode 103, the dielectric film 104, and the upper electrode 105 form a metal-dielectric-metal MIM structure.

Patent Document 1: International Publication No. 2018/003445

SUMMARY OF THE INVENTION

In the capacitor described in above-listed Patent Document 1, the terminal electrode 107b on the side next to the MIM structure is formed along a via hole provided in the protective layer 106 and is connected to the upper electrode, and the other terminal electrode 107a is formed along a via hole provided in the protective layer 106 and the dielectric film 104 and is connected to the lower electrode. As a result, concave recesses 108a and 108b are respectively formed in the upper surfaces of the terminal electrodes 107a and 107b. The recess 108a is deeper than the recess 108b by an amount equivalent to the thickness of the upper electrode and the dielectric film. The greater the difference between the depths of the recesses 108a and 108b, the greater the risk of problems arising such as tilting or defective bonding during mounting on substrate.

Therefore, an object of the present disclosure is to provide a capacitor in which the difference between the depths of terminal electrode recesses is small and that is excellent in terms of mountability.

A first aspect of the present disclosure is directed to a capacitor that includes: a substrate; a capacitor structure including a lower electrode on the substrate, a dielectric film on the lower electrode and having a via hole, and an upper electrode on the dielectric film; a first terminal electrode in the via hole and electrically connected to the lower electrode; and a second terminal electrode electrically connected to the upper electrode, where a width of the via hole of the dielectric film is less than or equal to twice a film thickness of the first terminal electrode.

A second aspect of the present disclosure is directed to a capacitor that includes: a substrate; a capacitor structure including a lower electrode on the substrate, a dielectric film on the lower electrode and having a via hole, and an upper electrode on the dielectric film; a first terminal electrode substantially completely filling the via hole and electrically connected to the lower electrode; and a second terminal electrode electrically connected to the upper electrode.

The capacitors described above can further include a protective layer on the lower electrode, the dielectric film, and the upper electrode.

The capacitors described above can further include a moisture resistant film on the dielectric film and the upper electrode.

In the capacitors described above, the dielectric film includes a plurality of the via holes.

In the capacitors described above, the via hole may have a rectangular shape in a plan view of the capacitor.

In the capacitors described above, the via hole may have a circular shape in the plan view.

In the capacitors described above, the plurality of via hole may form a grid-like pattern in the plan view.

In the capacitors described above, an inner surface of the via hole may be covered by a material identical to a material of the upper electrode.

In the capacitors described above, the via hole may be filled with a material identical to a material of the upper electrode.

In the capacitors described above, the capacitor structure may include a depression.

According to the present disclosure, an MIM capacitor having high mountability can be provided.

BRIEF DESCRIPTION OF THE DRAWINGS

FIG. 12 is a sectional view illustrating the structure of an MIM capacitor of the related art.

DETAILED DESCRIPTION OF THE PREFERRED EMBODIMENTS

Figure 1:
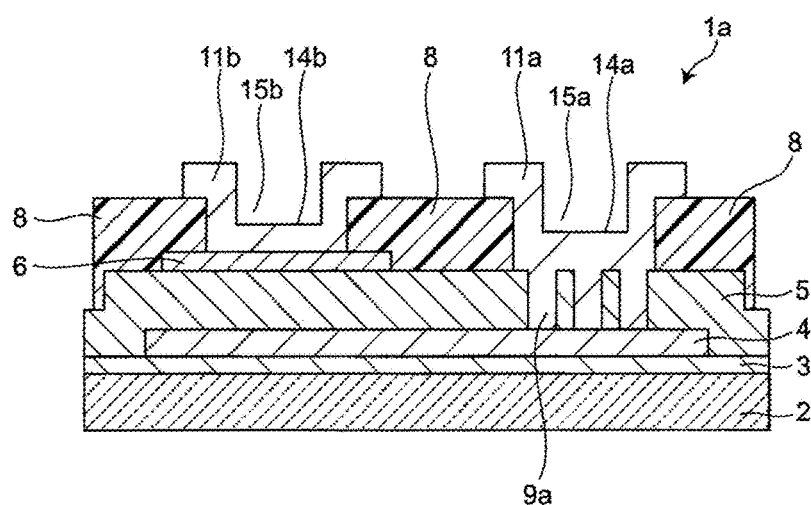
FIG. 1 is a sectional view of a capacitor 1a of a First Embodiment of the present disclosure.

Hereafter, capacitors of the present disclosure will be described in detail while referring to the drawings. However, the shapes, arrangements, and so forth of the constituent elements of the capacitors of the present disclosure are not limited to the illustrated examples.

First Embodiment

Figure 2:
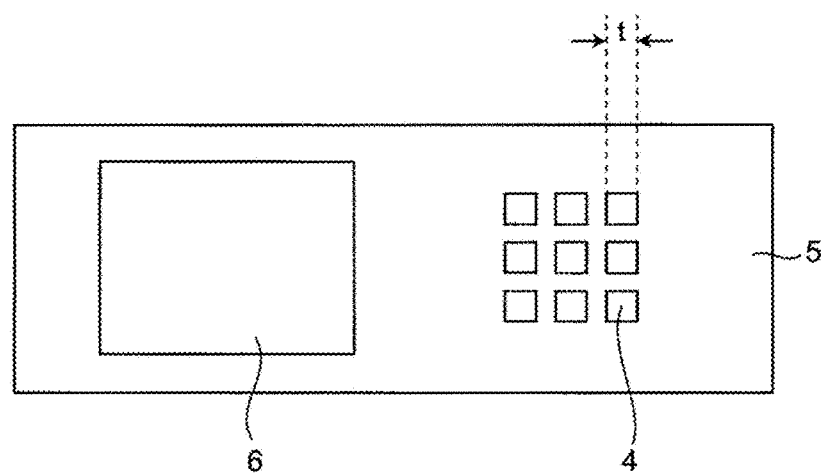
FIG. 2 is a plan view in which terminal electrodes and a protective layer of the capacitor 1a in FIG. 1 are omitted.

A sectional view of a capacitor 1a of a First Embodiment is illustrated in FIG. 1 and a plan view of the capacitor in which terminal electrodes and a protective layer of the capacitor 1a are omitted is illustrated in FIG. 2.

As illustrated in FIGS. 1 and 2, the capacitor 1a of this embodiment basically includes a substrate 2, an insulating film 3 provided on the substrate 2, a lower electrode 4 provided on the insulating film 3, a dielectric film 5 provided on the lower electrode 4, an upper electrode 6 provided on the dielectric film 5, a protective layer 8 provided on the dielectric film 5 and the upper electrode 6, and a first terminal electrode 11a and a second terminal electrode 11b provided on the protective layer 8. The protective layer 8 has through holes 15a and 15b. In addition, the dielectric film 5 has via holes 9a. The first terminal electrode 11a is electrically connected to the lower electrode 4 via the through hole 15a and the via holes 9a. The second terminal electrode 11b is electrically connected to the upper electrode 6 via the through hole 15b. The first terminal electrode 11a and the second terminal electrode 11b are respectively formed on the wall surfaces of the through holes 15a and 15b and the upper surfaces (surfaces on upper side in FIG. 1) of the first terminal electrode 11a and the second terminal electrode 11b respectively have recesses 14a and 14b. In the capacitor 1a, the lower electrode 4, the dielectric film 5, and the upper electrode 6 are stacked in this order and form an MIM capacitor structure, and charge can be made to accumulate in the dielectric film 5 by applying a voltage between the lower electrode 4 and the upper electrode 6. The capacitor of the present disclosure is unlikely to become tilted while being mounted on a substrate and problems such as defective bonding are suppressed due to the difference between the depth of the recess in the first terminal electrode 11a and the depth of the recess in the second terminal electrode 11b being small.

The above-described capacitor 1a is manufactured in the following way, for example.

First, the substrate 2 is prepared.

The substrate 2 is not particularly limited, but may preferably be a semiconductor substrate such as a silicon substrate or a gallium arsenide substrate, or an insulating substrate such as one composed of glass or alumina.

Figure 11A:
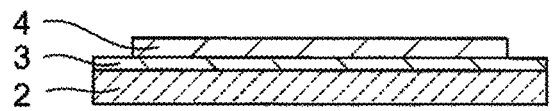
FIGS. 11(a) to 11(f) are sectional views for describing a method of manufacturing the capacitor 1a of the First Embodiment of the present disclosure.

Next, the insulating film 3 is formed on the entirety of the substrate 2 (FIG. 11(a)).

In this embodiment, the insulating film 3 is provided so as to cover the entirety of the substrate 2.

For example, the insulating film 3 can be formed using sputtering, a physical vapor deposition (PVD) method, a chemical vapor deposition (CVD) method, or the like.

The thickness of the insulating film 3 is not particularly limited so long as the substrate 2 and a layer formed above the insulating film can be insulated from each other, and is, for example, 0.05 µm or greater and preferably 0.10 µm or greater. In addition, the thickness of the insulating film 3 is preferably 10 µm or less, more preferably 1.0 µm or less, and still more preferably 0.50 µm or less from the viewpoint of reducing the thickness of the capacitor 1a.

The material constituting the insulating film 3 is not particularly limited, but may preferably be $SiO_2$, $Si_3N_4$, $Al_2O_3$, $HfO_2$, $Ta_2O_5$, or $ZrO_2$ and more preferably may be $SiO_2$, $Si_3N_4$, or $Al_2O_3$.

Next, the pattern of the lower electrode 4 is formed on the insulating film 3 (FIG. 11(a)).

In this embodiment, the lower electrode 4 is provided on the insulating film 3 in a region other than the outer periphery of the insulating film 3. In other words, in the plan view, the lower electrode 4 is provided in a region inside the region occupied by the substrate 2 and the insulating film 3. As a result of the lower electrode not being formed up to the edges of the insulating film and the substrate, the lower electrode 4 is not exposed from the end surfaces of the capacitor 1a and short circuits with another component or the like can be prevented.

For example, a lift-off method, a plating method, sputtering, vapor deposition, photolithography, etching, or the like can be used as the method of forming the pattern of the lower electrode 4. For example, a combination of sputtering, photolithography, and etching may be used to form the pattern.

The thickness of the lower electrode 4 is not particularly limited, but is preferably from 0.5 µm to 10 µm and more preferably from 1 µm to 6 µm. By making the thickness of the lower electrode greater than or equal to 0.5 µm, the resistance of the electrode can be reduced and the effect on the radio-frequency characteristics of the capacitor can be suppressed. By making the thickness of the lower electrode less than or equal to 10 µm, a reduction in the mechanical strength of the device due to stress in the electrode can be suppressed and deformation of the capacitor can be suppressed.

The material constituting the lower electrode 4 is not limited to any particular material, but is preferably Cu, Ag, Au, Al, Ni, Cr, or Ti or an alloy of any of these metals, or a conductor containing any of these materials, and Cu, Ag, Au or Al is more preferable.

Figure 11B:
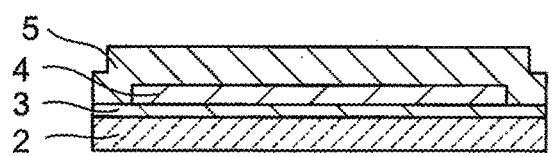
Figure 11C:
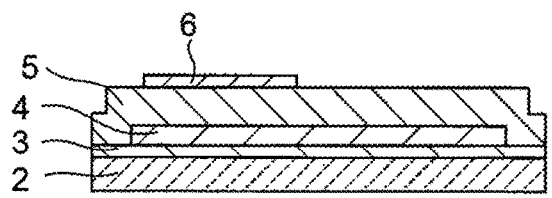
Figure 11D:
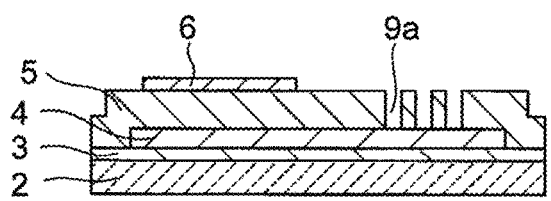
Figure 11E:
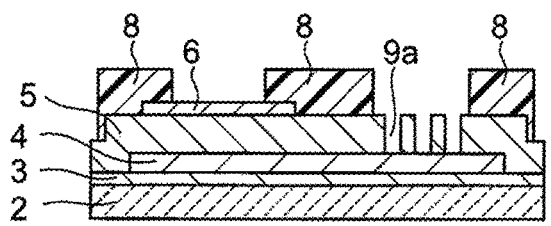
Figure 11F:
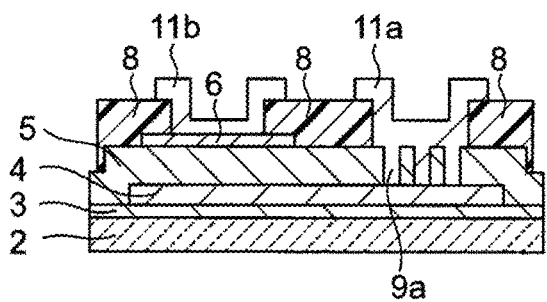

Next, the dielectric film 5 is formed on the lower electrode 4 (FIG. 11(b)).

In this embodiment, the dielectric film 5 is formed across the entire upper surface of the substrate so as to cover the lower electrode 4. Via holes are formed in the dielectric film 5 in a later via hole forming step. By covering the lower electrode with a dielectric film, the lower electrode can be prevented from being exposed at end surfaces of the capacitor and can be prevented from electrically contacting an unintended component.

For example, the dielectric film 5 can be formed using sputtering, a PVD method, a CVD method, or the like.

The thickness of the dielectric film 5 is not particularly limited, but is preferably from 50 nm to 10 µm and more preferably from 0.1 µm to 3.0 µm. The insulation resistance can be improved by making the thickness of the dielectric film greater than or equal to 50 nm. By making the thickness of the dielectric film less than or equal to 10 µm, a reduction in the mechanical strength of the device caused by stress in the dielectric film can be suppressed and deformation of the capacitor can be suppressed.

The material constituting the dielectric film 5 is not particularly limited, but is preferably an oxide or a nitride such as $SiO_2$, $Si_3N_4$, $Al_2O_3$, $HfO_2$, $Ta_2O_5$, or $ZrO_2$.

Next, the pattern of the upper electrode 6 is formed on the dielectric film 5 (FIG. 11(*c*)). The upper electrode 6 is provided so that at least part and preferably the entirety thereof faces the lower electrode 4 with the dielectric film 5 therebetween. Thus, a capacitor structure consisting of upper electrode 6—dielectric film 5—lower electrode 4 is obtained.

Similarly to the lower electrode 4, for example, a lift off method, a plating method, sputtering, vapor deposition, photolithography, etching, and so on can be used as the method for forming the pattern of the upper electrode 6. For example, a combination of sputtering, photolithography, and etching may be used to form the pattern.

The thickness of the upper electrode 6 is not particularly limited, but is preferably from 0.5 µm to 10 µm and more preferably from 1 µm to 6 µm for the same reasons as the lower electrode 4. In addition, the thickness of the upper electrode 6 is preferably less than the thickness of the lower electrode 4. The length of the upper electrode 6 is preferably less than the length of the lower electrode 4. This is because the equivalent series resistance increases when the thickness of the lower electrode 4 is small.

The material constituting the upper electrode 6 is not particularly limited, but is preferably Cu, Ag, Au, Al, Ni, Cr, or Ti or an alloy of any of these metals, or a conductor containing any of these materials, and Cu, Ag, Au or Al is more preferable.

The via holes 9*a* are formed in the dielectric film 5 (FIG. 11(*d*)).

For example, etching or the like can be performed as the method for forming the via holes.

In this embodiment, the via holes 9*a* are formed to have a quadrangular shape in the plan view. In other words, the via holes 9*a* have a quadrangular (substantially square) cross-sectional shape when cut along a plane parallel to a main surface of the substrate 2. However, in the capacitor of the present disclosure, the cross-sectional shape of the via holes is not particularly limited and may be a freely chosen shape such as a circular shape, an elliptical shape, a triangular shape, and so on.

In one aspect, the width of the via holes 9*a* is less than or equal to twice and preferably less than or equal to 1.8 times the film thickness of the first terminal electrode 11*a* described below. In addition, the width of the via holes 9*a* is preferably greater than or equal to 0.5 times and more preferably greater than or equal to 1.0 times the film thickness of the first terminal electrode 11*a*. By making the width of the via holes less than or equal to twice the film thickness of the first terminal electrode, it is possible to completely fill the via holes with the first terminal electrode when forming the first terminal electrode, especially when forming the first terminal electrode using an isotropic film formation method such as plating, and as a result, it is possible to raise the bottom of the recess in the first terminal electrode. By making the width of the via holes greater than or equal to 0.5 times the film thickness of the first terminal electrode, the inside of the via holes can be completely filled with the first terminal electrode without excessively increasing the film thickness of the first terminal electrode.

The "width" of the via holes may be the distance between opposing sides when the cross-section of the via holes has a square shape, the distance between the long sides when the cross-section has a rectangular shape, the diameter when the cross-section has a circular shape, or the shorter diameter when the cross-section has an elliptical shape. In addition, "the film thickness of the first terminal electrode" is the thickness of a layer deposited when forming the first terminal electrode and is typically the thickness of the first terminal electrode formed on the upper surface of the capacitor. In the case where the first terminal electrode is formed of a plurality of layers, "the film thickness of the first terminal electrode" refers to the total thickness of all the layers.

In the capacitor of the present disclosure, the distance from any point in the internal space of a via hole to the nearest wall surface of the via hole is preferably less than or equal to the film thickness of the first terminal electrode, and is preferably less than or equal to 0.9 times the film thickness of the first terminal electrode. With this configuration, it is easy to completely fill the via holes with the first terminal electrode when forming the first terminal electrode using an isotropic film formation method such as plating.

In this embodiment, a total of nine via holes 9*a* are formed in three vertical lines and three horizontal lines, but in the capacitor of the present disclosure, the number of such via holes is not particularly limited, and may be one or a plurality such as 2 to 10, 3 to 9, or 4 to 6.

Next, the pattern of the protective layer 8 is formed on the dielectric film 5 and the upper electrode 6 (FIG. 11(*e*)).

In this embodiment, the protective layer 8 has the through holes 15*a* and 15*b* in which the terminal electrodes 11*a* and 11*b* will be formed and is provided so as to cover the regions other than the through holes. The through hole 15*a* is provided so that the via hole formed as described above is exposed. The through hole 15*b* is provided so that the upper electrode 6 is exposed.

For example, the protective layer 8 can be formed using spin coating. In addition, for example, photolithography, etching, or the like can be used as the method for forming the pattern of the protective layer 8.

The thickness of the protective layer 8 is not particularly limited, but is preferably from 1 µm to 20 µm and more preferably from 3 µm to 15 µm. By making the thickness of the protective layer greater than or equal to 1 µm, capacitances between the terminal electrodes 11*a* and 11*b* and the lower electrode 4 across the protective layer 8 can be made small compared with the capacitance between the lower electrode 4 and the upper electrode 6 across the dielectric film 5 and the effect of the voltage variations and frequency characteristics of the capacitances across the protective layer 8 on the capacitor as a whole can be made small. By making the thickness of the protective layer 8 less than or equal to 20 µm, it is possible to use a low-viscosity material for the protective layer, and this makes it easier to control the thickness and makes it possible to suppress variations in the capacitance of the capacitor.

The material constituting the protective layer 8 is not particularly limited, but is preferably a resin material such as polyimide.

Next, the patterns of the first terminal electrode 11*a* and the second terminal electrode 11*b* (hereafter, also collectively referred to as "terminal electrodes 11") are formed (FIG. 11(*f*)).

Here, the terminal electrodes are electrodes that provide terminal surfaces or terminal parts for connecting the capacitor to other electrical elements. The first terminal electrode refers to a region from a terminal surface or terminal part up to the part connected to the lower electrode 4, and the second terminal electrode refers to a region from a terminal surface or terminal part up to the part connected to the upper electrode 6. Each terminal electrode consists of a single member or a plurality of members.

In this embodiment, the terminal electrodes 11*a* and 11*b* are formed in the through holes 15*a* and 15*b* and on the protective layer 8 around the peripheries of the through holes. In other words, the outer edges of the terminal electrodes are located on the upper surface of the protective layer 8.

The first terminal electrode 11a and the second terminal electrode 11b have the recesses 14a and 14b in the upper surfaces thereof due to the through holes in the protective layer.

In the capacitor of the present disclosure, the difference between the depth of the recess 14a of the first terminal electrode 11a and the depth of the recess 14b of the second terminal electrode 11b is small. For example, the depth of the recess 14a may be preferably 1.5 times or less, more preferably 1.2 times or less, and even more preferably 1.1 times or less the depth of the recess 14b. In addition, the depth of the recess 14a may be preferably 0.6 times or more, more preferably 0.8 times or more, and even more preferably 0.9 times or more the depth of the recess 14b. In a preferable aspect, the depth of the recess 14a and the depth of the recess 14b are substantially the same, and for example the difference between the two depths may lie within 1% the depth of the deeper recess. By making the difference between the depth of the recess 14a of the first terminal electrode 11a and the depth of the recess 14b of the second terminal electrode 11b small, the capacitor is less likely to become tilted when being mounted on a substrate and bonding can be performed more reliably.

In a preferable aspect, the first terminal electrode 11a substantially completely fills the insides of the via holes 9a. For example, the first terminal electrode 11a fills 95% or more, more preferably 98% or more, and even more preferably 99% or more of the spaces inside the via holes 9a. The resistance of the electrode can be sufficiently reduced while raising the bottom of the recess 14a by forming via holes in the dielectric film and filling the insides of the via holes with the first terminal electrode.

Similarly to the lower electrode 4, a lift off method, a plating method, or a semi-additive method can be used as the method for forming the terminal electrodes 11a and 11b.

The material constituting the terminal electrodes 11a and 11b is not particularly limited, but is preferably Cu, Ni, Ag, Au, or Al, for example.

In a preferable aspect, each terminal electrode may have a plating layer composed of Ni, Au or the like and preferably has an Au plating layer on the outermost surface thereof.

In a preferable aspect, the material constituting the terminal electrodes 11a and 11b is a material having a lower resistivity than the material of the lower electrode 4 and the upper electrode 6 and may be, for example, Cu or Al.

A collective substrate containing a plurality of capacitor elements is manufactured through the above series of processes. The collective substrate is thinned down to the desired device thickness by performing back grinding. After that, the collective substrate is divided into pieces using a method such as blade dicing, stealth dicing, or plasma dicing. In other words, the collective substrate is cut into pieces that are the size of individual capacitors.

The capacitor 1a according to Embodiment 1 is manufactured as described above.

Second Embodiment

Figure 3A:
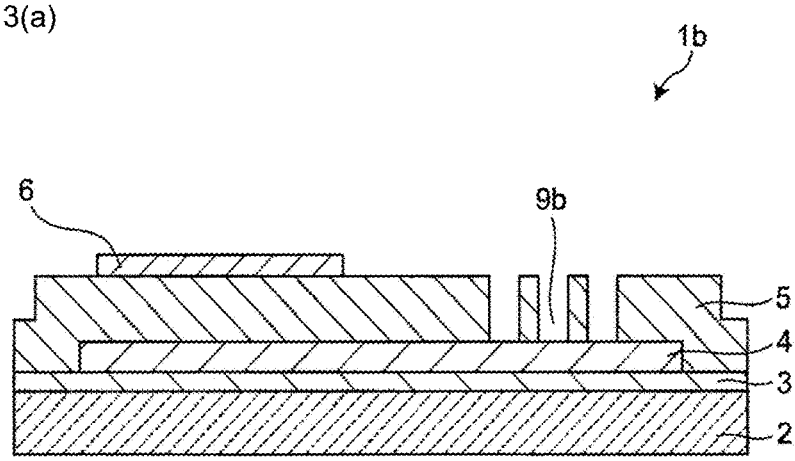
FIG. 3(a) is a sectional view and FIG. 3(b) is a plan view in which terminal electrodes and a protective layer of a capacitor 1b of a Second Embodiment of the present disclosure are omitted.
Figure 3B:
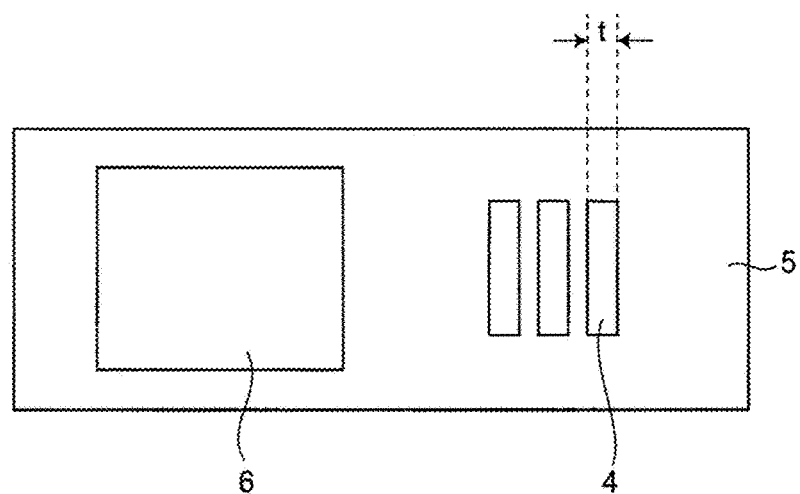

FIG. 3(a) illustrates a sectional view and FIG. 3(b) illustrates a plan view in which the terminal electrodes and protective layer of a capacitor 1b of a Second Embodiment are omitted. The terminal electrodes and the protective layer of the capacitor 1b of the Second Embodiment are the same as those of the capacitor 1a of the First Embodiment.

As illustrated in FIGS. 3(a) and 3(b), the capacitor 1b of the Second Embodiment has the same configuration as the capacitor 1a of the First Embodiment except that the shape of via holes 9b are different from the shape of the via holes 9a.

The via holes 9b of the capacitor 1b are formed as three rectangular via holes in the plan view. In other words, the cross-sectional shape of the via holes 9b in a plane parallel to a main surface of the substrate 2 is a rectangular shape. The width of each via hole 9b is a distance t between the long sides in FIG. 3(b).

By forming the via holes so as to have a rectangular cross section, the contact area between the first terminal electrode and the lower electrode 4 is increased, and the Q-value of the capacitor is improved.

Third Embodiment

Figure 4A:
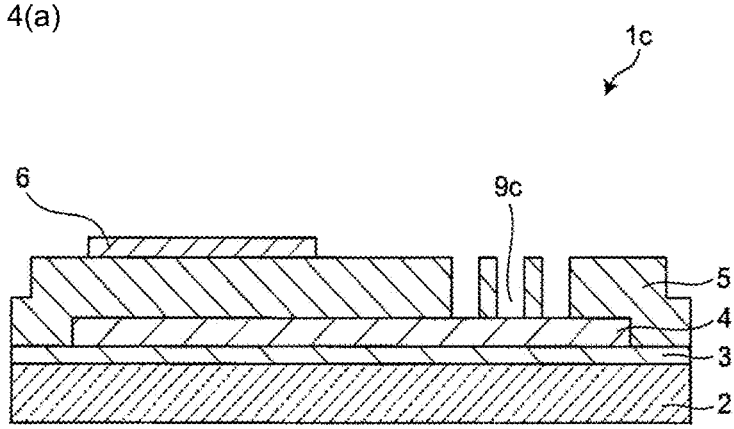
FIG. 4(a) is a sectional view and FIG. 4(b) is a plan view in which terminal electrodes and a protective layer of a capacitor 1c of a Third Embodiment of the present disclosure are omitted.
Figure 4B:
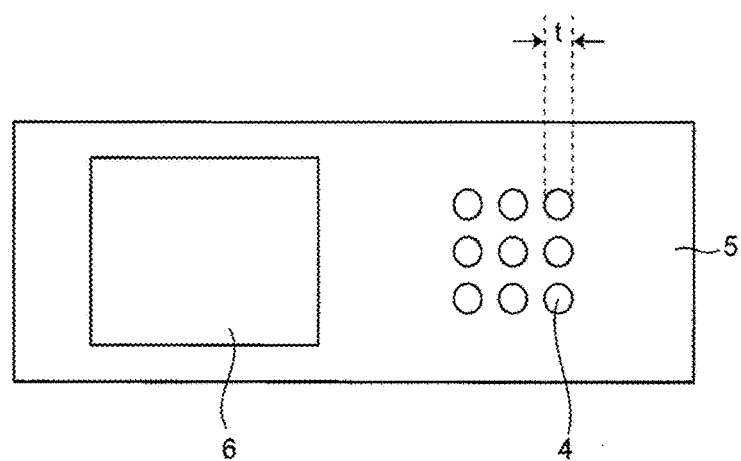

FIG. 4(a) illustrates a sectional view and FIG. 4(b) illustrates a plan view in which the terminal electrodes and protective layer of a capacitor 1c of a Third Embodiment are omitted. The terminal electrodes and the protective layer of the capacitor 1c of the Third Embodiment are the same as those of the capacitor 1a of the First Embodiment.

As illustrated in FIGS. 4(a) and 4(b), the capacitor 1c of the Third Embodiment has the same configuration as the capacitor 1a of the First Embodiment except that the shape of via holes 9c is different from the shape of the via holes 9a.

The via holes 9c of the capacitor 1c are formed to have a circular shape in the plan view and a total of nine via holes 9c are formed in three horizontal lines and three vertical lines. In other words, the cross-sectional shape of the via holes 9c in a plane parallel to a main surface of the substrate 2 is a circular shape. The width of the via holes 9c is a diameter t of a circle in FIG. 4(b).

Electrolytic concentration and stress concentration can be suppressed by forming the via holes so as to have a circular cross-sectional shape.

However, although the via holes 9c have a circular cross-sectional shape in this embodiment, the cross-sectional shape may instead be a so-called rounded shape such as a quadrangular shape with rounded corners.

Fourth Embodiment

Figure 5A:
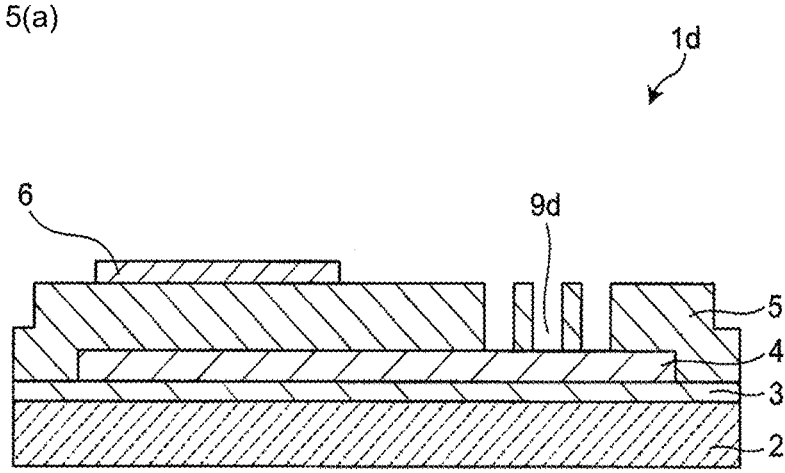
FIG. 5(a) is a sectional view and FIG. 5(b) is a plan view of a capacitor 1d of a Fourth Embodiment of the present disclosure.
Figure 5B:
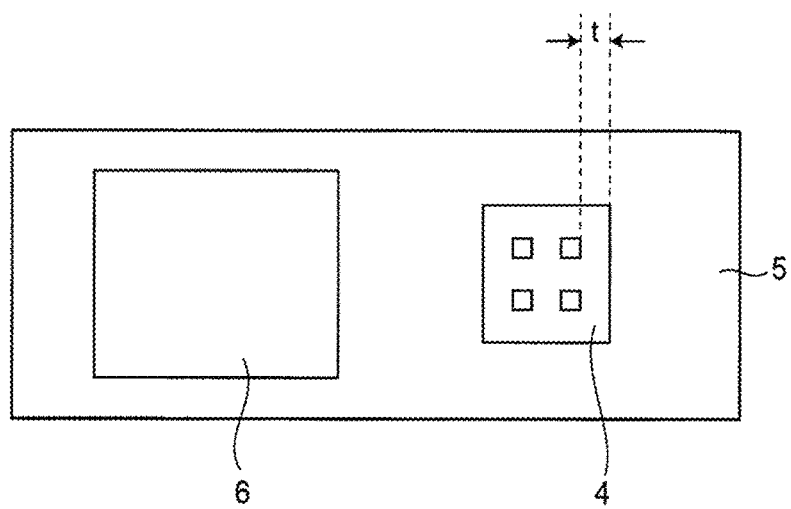

FIG. 5(a) illustrates a sectional view and FIG. 5(b) illustrates a plan view in which the terminal electrodes and protective layer of a capacitor 1d of a Fourth Embodiment are omitted. The terminal electrodes and the protective layer of the capacitor 1d of the Fourth Embodiment are the same as those of the capacitor 1a of the First Embodiment.

As illustrated in FIGS. 5(a) and 5(b), the capacitor 1d of the Fourth Embodiment has the same configuration as the capacitor 1a of the First Embodiment except that the shape of via holes 9d is different from the shape of the via holes 9a.

The via holes 9d of the capacitor 1d are formed in a grid pattern in the plan view. In other words, the cross-sectional shape of the via holes 9d in a plane parallel to a main surface of the substrate 2 form a grid pattern. The grid pattern can also be thought of as being a shape that is a combination of rectangles. The width of the via holes 9d is a width t of the walls of the grid in FIG. 5(b).

By forming the via holes so as to form a grid-like cross section, the contact area between the first terminal electrode and the lower electrode 4 is increased, and the Q-value of the capacitor is improved.

Fifth Embodiment

Figure 6:
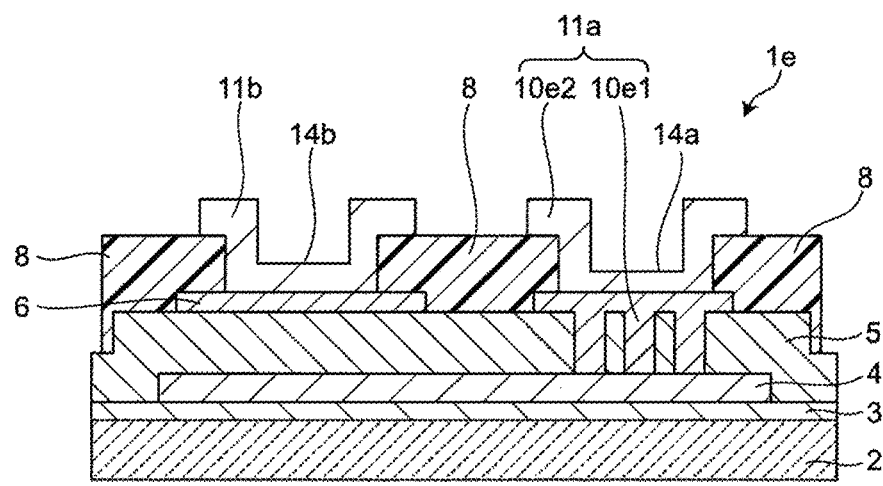
FIG. 6 is a sectional view of a capacitor 1e of a Fifth Embodiment of the present disclosure.

FIG. 6 illustrates a sectional view of a capacitor 1e of a Fifth Embodiment.

As illustrated in FIG. 6, the capacitor 1e of the Fifth Embodiment has the same configuration as the capacitor 1a of the First Embodiment except that the first terminal electrode 11a is formed of a terminal electrode part 10e1 and a terminal electrode part 10e2.

When manufacturing the capacitor 1e having this configuration, the part 10e1 can be formed at the same time as the upper electrode 6 and the part 10e1 is formed so as to have the same thickness as the upper electrode 6. Therefore, the bottom of the recess of the first terminal electrode 11a is raised by an amount equivalent to the thickness of the part 10e1, the difference between the depths of the recess 14a and the recess 14b is reduced, and mounting stability is improved. Furthermore, since the part 10e1 having the same thickness as the upper electrode 6 is formed, this configuration is also advantageous in that the difference between the depths of the recesses 14a and 14b is no longer affected by the thickness of the upper electrode 6.

In this embodiment, the part 10e1 substantially completely fills the insides of the via holes. For example, the part 10e1 fills 95% or more, more preferably 98% or more, and still more preferably 99% or more of the spaces inside the via holes. The resistance of the electrode can be sufficiently reduced while raising the bottom of the recess of the first terminal electrode by forming via holes in the dielectric film and filling the insides of the via holes with the part 10e1.

The first terminal electrode 11a of the capacitor 1e can be formed by forming the part 10e1 at the same time as the upper electrode, and then, forming the part 10e2 at the same time as the second terminal electrode 11b.

The part 10e1 is preferably formed from the same material and with the same method as the upper electrode.

In a preferable aspect, the width of the via holes is less than or equal to twice and preferable less than or equal to 1.8 times the film thickness of the part 10e1. In addition, the width of the via holes is preferably 0.5 times or more and more preferably 1.0 times or more the film thickness of the part 10e1. By making the width of the via holes less than or equal to twice the film thickness of the part 10e1, it is possible to completely fill the via holes with the part 10e1 when forming the part 10e1, especially when forming the part 10e1 using an isotropic film formation method such as plating, and as a result, it is possible to raise the bottom of the recess of the first terminal electrode. By making the width of the via holes greater than or equal to 0.5 times the film thickness of the part 10e1, the insides of the via holes can be filled with the part 10e1 without excessively increasing the film thickness of the part 10e1.

Sixth Embodiment

Figure 7:
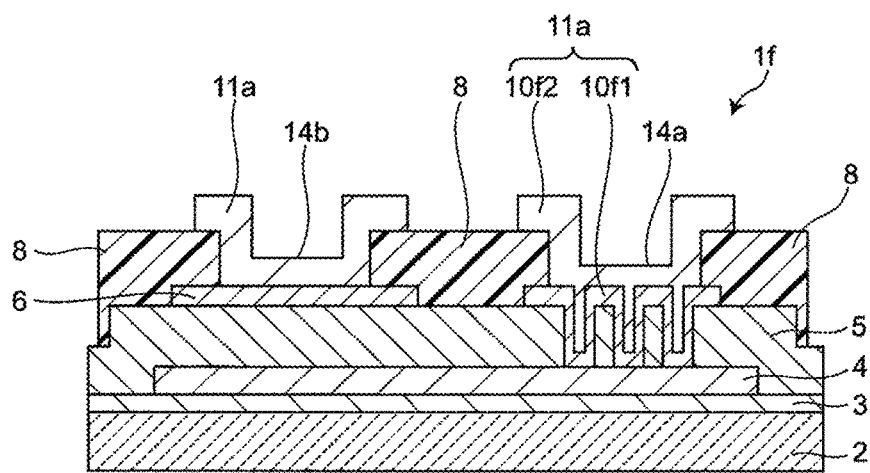
FIG. 7 is a sectional view of a capacitor 1f of a Sixth Embodiment of the present disclosure.

FIG. 7 illustrates a sectional view of a capacitor 1f of a Sixth Embodiment.

As illustrated in FIG. 7, the capacitor 1f of the Sixth Embodiment has the same configuration as the capacitor 1e of the Fifth Embodiment except that the first terminal electrode 11a is formed of a terminal electrode part 10f1 and a terminal electrode part 10f2.

When manufacturing the capacitor 1f having this configuration, the part 10f1 can be formed at the same time as the upper electrode 6 and the part 10f1 is formed so as to have the same thickness as the upper electrode 6. Therefore, the bottom of the recess of the first terminal electrode 11a is raised by an amount equivalent to the thickness of the part 10f1, the difference between the depths of the recess 14a and the recess 14b is reduced, and mounting stability is improved. Furthermore, since the part 10f1 having the same thickness as the upper electrode 6 is formed, this configuration is also advantageous in that the difference between the depths of the recesses 14a and 14b is no longer affected by the thickness of the upper electrode 6.

Furthermore, in this embodiment, the part 10f1 is formed along inner wall surfaces of the via holes and is not present at the centers of the spaces inside the via holes. This aspect can be obtained by making the widths of the via holes larger than twice the thickness of the part 10f1, for example. Since the part 10f2 is formed in the spaces inside the via holes, the contact area between the part 10f1 and the part 10f2 is increased and contact resistance is decreased.

The first terminal electrode 11a of the capacitor 1f can be formed by forming the part 10f1 at the same time as the upper electrode, and then, forming the part 10f2 at the same time as the second terminal electrode 11b.

The part 10f1 is preferably formed from the same material and with the same method as the upper electrode.

Seventh Embodiment

Figure 8:
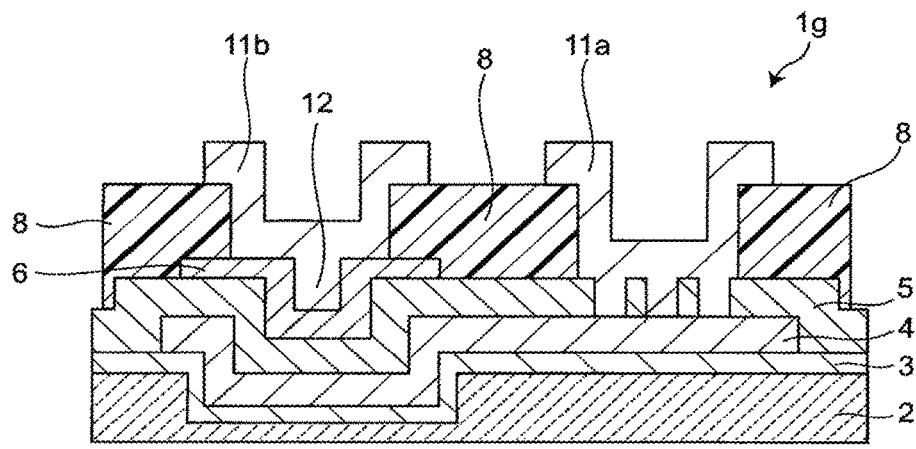
FIG. 8 is a sectional view of a capacitor 1g of a Seventh Embodiment of the present disclosure.

FIG. 8 illustrates a sectional view of a capacitor 1g of a Seventh Embodiment.

As illustrated in FIG. 8, the capacitor 1g of the Seventh Embodiment has the same configuration as the capacitor 1a of the First Embodiment except that the capacitor structure includes a depression 12.

By forming a depression in the capacitor structure, the contact areas between the lower electrode 4, the dielectric film 5, and the upper electrode 6 are increased and the capacitance of the capacitor can be increased.

The shape of the depression is not particularly limited, and for example, the cross-sectional shape obtained when cutting along a plane parallel to a main surface of the substrate 2 may be any suitable shape such as a circle, an ellipse, a triangle, a square, a rectangle, and so on. Furthermore, the number of depressions is also not particularly limited and the number of depressions may be one or a plurality such as 2 to 10.

In a preferable aspect, the width of the depression (width of depression in upper electrode) is less than or equal to twice and preferably less than or equal to 1.8 times the film thickness of the second terminal electrode. In addition, the width of the depression is preferably 0.5 times or more and more preferably 1.0 times or more the film thickness of the second terminal electrode. By making the width of the depression less than or equal to twice the film thickness of the second terminal electrode, the depression can be completely filled with the second terminal electrode when forming the second terminal electrode, especially when forming the second terminal electrode using an isotropic film formation method such as plating.

Eighth Embodiment

Figure 9:
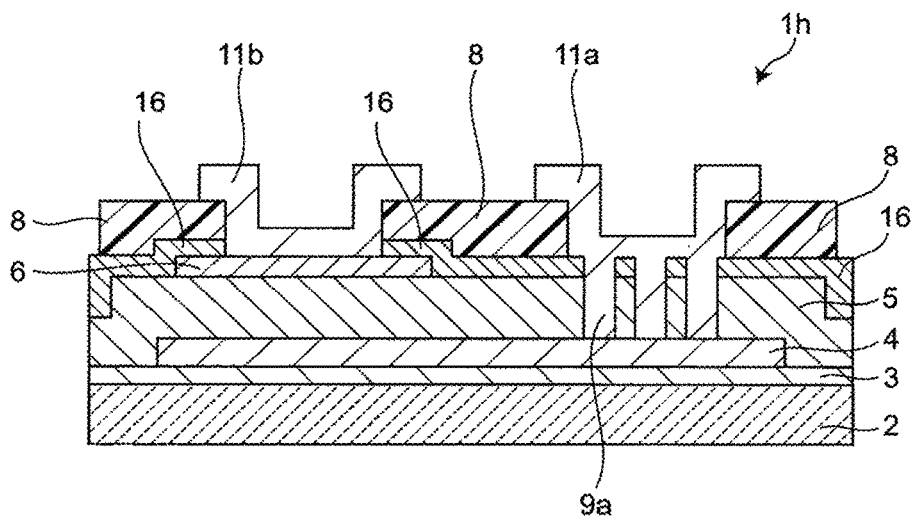
FIG. 9 is a sectional view of a capacitor 1h of an Eighth Embodiment of the present disclosure.

FIG. 9 illustrates a sectional view of a capacitor 1h of an Eighth Embodiment.

As illustrated in FIG. 9, the capacitor 1h of the Eighth Embodiment has the same configuration as the capacitor 1a of the First Embodiment except that a moisture resistant film 16 is provided on the dielectric film 5 and the upper electrode 6.

In this embodiment, the moisture resistant film 16 is provided so as to cover the dielectric film 5 and the upper electrode 6. However the moisture resistant film 16 is not present in regions where the terminal electrodes 11 are located. By providing the moisture resistant film, corrosion and so on of the upper electrode caused by moisture can be prevented, moisture resistance is improved, and consequently reliability is improved.

For example, the moisture resistant film 16 can be formed using sputtering, a CVD method, and so on. Patterning can be performed using photolithography, etching, or the like.

The thickness of the moisture resistant film 16 is not particularly limited, but is preferably from 0.5 µm to 10 µm and more preferably from 1 µm to 3 µm. By making the thickness of the moisture resistant film 16 greater than or equal to 0.5 µm, moisture resistance can be secured with more certainty. By making the thickness of the moisture resistant film 16 less than or equal to 10 µm, it is possible to prevent reductions in mechanical strength and deformation of the capacitor caused by film stress.

The material constituting the moisture resistant film 16 is not particularly limited, but is preferably a moisture resistant material such as $Si_3N_4$ or $SiO_2$.

Ninth Embodiment

Figure 10:
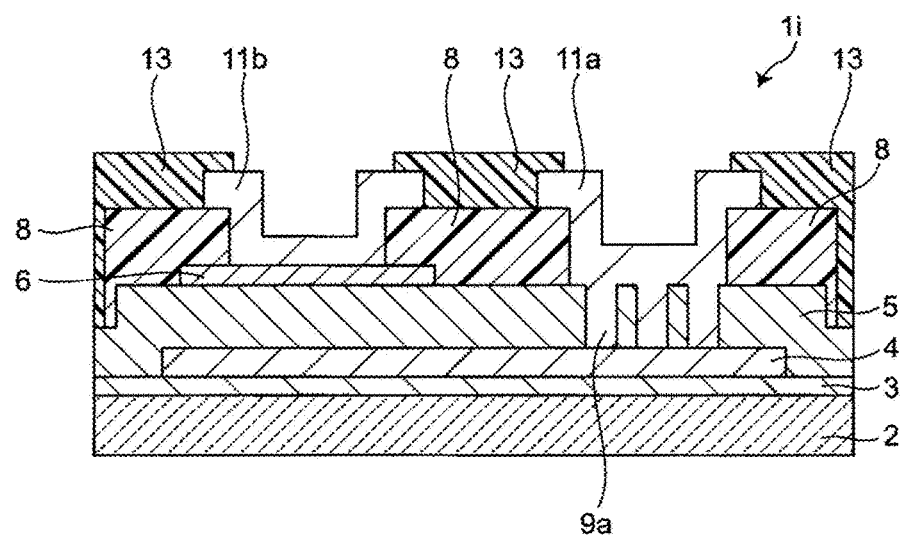
FIG. 10 is a sectional view of a capacitor 1i of an Eighth Embodiment of the present disclosure.

FIG. 10 illustrates a sectional view of a capacitor 1i of a Ninth Embodiment.

As illustrated in FIG. 10, the capacitor 1i of the Ninth Embodiment has the same configuration as the capacitor 1a of the First Embodiment except that a second protective layer 13 is provided as an outermost layer.

By providing the second protective layer 13 on the outermost surface of the capacitor 1i, solder erosion of the terminal electrodes and chipping during cutting with a dicing machine can be prevented and consequently reliability is improved. Here, "outermost layer" refers to the layer provided on the outermost side of the surface where the terminal electrodes 11 are exposed.

The second protective layer 13 can be formed using the same material and with the same method as the protective layer 8.

Capacitors of the present disclosure have been described above, but the capacitors of the present disclosure can be modified in various ways.

For example, a seed layer may be formed on the protective layer 8 and then the terminal electrodes may be formed.

By forming a seed layer on the protective layer before forming the terminal electrodes, the adhesion of the terminal electrodes can be improved. The seed layer forms part of the terminal electrodes.

For example, sputtering, electroless plating, and so on can be used as the method for forming the seed layer.

The thickness of the seed layer is not particularly limited, but is preferably from 0.5 µm to 10 µm and more preferably from 1 µm to 3 µm. The later formation of the terminal electrodes is easier when the thickness of the seed layer is made greater than or equal to 0.5 µm. By making the thickness of the seed layer less than or equal to 10 µm, a reduction in mechanical strength caused by stress in the seed layer can be suppressed and deformation of the capacitor can be suppressed.

The material constituting the seed layer is not particularly limited, but is preferably Ti or Cu.

Capacitors of the present disclosure are suitably used in various electronic devices due to their high mountability.

REFERENCE SIGNS LIST 1a to 1i . . . capacitor
2 . . . substrate
3 . . . insulating film
4 . . . lower electrode
5 . . . dielectric film
6 . . . upper electrode
8 . . . protective layer
9a to 9d . . . via hole
10e1, 10e2 . . . terminal electrode part
10f1, 10f2 . . . terminal electrode part
11a . . . first terminal electrode
11b . . . second terminal electrode
12 . . . depression
13 . . . second protective layer
14a, 14b . . . recess
15a, 15b . . . through hole
16 . . . moisture resistant film
100 . . . capacitor
101 . . . substrate
102 . . . insulating film
103 . . . lower electrode
104 . . . dielectric film
105 . . . upper electrode
106 . . . protective layer
107a, 107b . . . terminal electrode
108a, 108b . . . recess

The invention claimed is:

1. A capacitor comprising:
a substrate;
a capacitor structure on the substrate, the capacitor structure including:
a single lower electrode;
a single upper electrode; and
a dielectric film between the single lower electrode and the single upper electrode, the dielectric film including a plurality of via holes;
a single first terminal electrode in the plurality of via holes, in direct contact with the dielectric film, and electrically connected to the single lower electrode;
a single second terminal electrode electrically connected to the single upper electrode; and
a protective layer on the single lower electrode, the dielectric film, and the single upper electrode,
wherein a width of the plurality of via holes is less than or equal to twice a film thickness of the first terminal electrode, wherein
the single first terminal electrode comprises a plurality of protrusions filling each of the plurality of via holes.

2. The capacitor according to claim 1, wherein the width of the plurality of via holes is 0.5 to 1.8 times the film thickness of the first terminal electrode.

3. The capacitor according to claim 1, further comprising:
a moisture resistant film on the dielectric film and the upper electrode.

4. The capacitor according to claim 1, wherein the plurality of via holes have a rectangular shape in a plan view of the capacitor.

5. The capacitor according to claim 1, wherein the plurality of via holes have a circular shape in a plan view of the capacitor.

6. The capacitor according to claim 1, wherein the plurality of via holes form a grid-like pattern in a plan view of the capacitor.

7. The capacitor according to claim 1, wherein an inner surface of the plurality of via holes are covered by a material identical to a material of the upper electrode.

8. The capacitor according to claim 1, wherein the plurality of via holes are filled with a material identical to a material of the upper electrode.

9. The capacitor according to claim 1, wherein the capacitor structure includes a depression in a contact area between the lower electrode, the dielectric film, and the upper electrode.

10. A capacitor comprising:
a substrate;
a capacitor structure including:
a lower electrode on the substrate;
a dielectric film on the lower electrode, the dielectric film including a plurality of via holes;
an upper electrode on the dielectric film;
a first terminal electrode comprising a plurality of protrusions extending from an upper surface of the dielectric film and into and substantially completely filling the plurality of via holes, in direct contact with the dielectric film, and electrically connected to the lower electrode; and
a second terminal electrode electrically connected to the upper electrode.

11. The capacitor according to claim 10, further comprising:
a protective layer on the lower electrode, the dielectric film, and the upper electrode.

12. The capacitor according to claim 10, further comprising:
a moisture resistant film on the dielectric film and the upper electrode.

13. The capacitor according to claim 10, wherein the plurality of via holes have a rectangular shape in a plan view of the capacitor.

14. The capacitor according to claim 10, wherein the plurality of via holes have a circular shape in a plan view of the capacitor.

15. The capacitor according to claim 10, wherein the plurality of via holes form a grid-like pattern in a plan view of the capacitor.

16. The capacitor according to claim 10, wherein the plurality of via holes are filled with a material identical to a material of the upper electrode.

17. The capacitor according to claim 10, wherein the capacitor structure includes a depression in a contact area between the lower electrode, the dielectric film, and the upper electrode.

* * * * *